United States Patent [19]

Yamamoto et al.

[11] 3,840,769

[45] Oct. 8, 1974

[54] LIGHT-EMITTING DISPLAY DEVICE HAVING LIGHT EMITTING ELEMENTS SURROUNDED BY BLACK CERAMIC

[75] Inventors: Hideharu Yamamoto; Takahikio Ihochi, both of Tokyo, Japan

[73] Assignee: Hitachi, Ltd., Tokyo, Japan

[22] Filed: Mar. 1, 1973

[21] Appl. No.: 336,997

[30] Foreign Application Priority Data

Mar. 1, 1972 Japan ................................ 47-20586

[52] U.S. Cl. .................. 313/500, 313/505, 313/506

[51] Int. Cl. .......................................... H05b 33/22

[58] Field of Search ......... 313/108 B, 108 D, 109.5; 315/169 TV; 340/166 R, 166 EL

[56] References Cited

UNITED STATES PATENTS

| | | | |
|---|---|---|---|
| 3,501,676 | 3/1970 | Adler et al. | 315/169 TV |
| 3,517,258 | 6/1970 | Lynch | 315/169 TV |

*Primary Examiner*—Herman Karl Saalbach
*Assistant Examiner*—Siegfried H. Grimm
*Attorney, Agent, or Firm*—Craig & Antonelli

[57] ABSTRACT

A light-emitting display device in which main metallic interconnection layers are insulated by a white ceramic layer, while the background of light-emitting elements is formed of a black ceramic layer, so that an indication of the device may be made clear without degrading the insulation between interconnections.

13 Claims, 3 Drawing Figures

LIGHT-EMITTING DISPLAY DEVICE HAVING LIGHT EMITTING ELEMENTS SURROUNDED BY BLACK CERAMIC

BACKGROUND OF THE INVENTION

1. Field of the Invention

The present invention relates to a light-emitting display device.

2. Description of the Prior Art

The light-emitting display device is indispensable as the digital display section of an arithmetic unit, etc. One of the known constructions thereof consists in that an interconnection layer is formed on a ceramic substrate, and that light-emitting elements made of an intermetallic compound semiconductor and various electrodes of the elements are, respectively, connected on the interconnection layer. The display device employing such light-emitting elements can be made small-sized and thin, and allows complicated internal connections. Therefore, it has the advantages of being suitable for a display unit for numerical values of many places, being solid and being essentially trouble-free, inexpensive, etc., and has recently been adopted in many fields.

In the prior-art display device of this type, however, the ceramics composing the substrate and the insulating layer are white. It has, therefore been disadvantageous in that the contrast between a luminous part and the ceramic layer, being its background, is low during light emission, with the result that the display becomes indistinct and difficult to read. Accordingly, the inventors have attempted to make the indication distinct by blackening the insulating layer, namely, the ceramic layer of the light-emitting display device.

A black ceramic layer can be formed as follows. Alumina powder, being the principal ceramic ingredient, is mixed with oxides of specific metals, for example, titanium dioxide ($TiO_2$). The powdery mixture is made pasty, and the paste is applied on a substrate in a print-like manner. Thereafter, the applied paste is subjected to a sintering treatment in a reducing atmosphere. Thus, $TiO_2$ is reduced in an imperfect state and is ionized, to cause lattice defects and to present a black color.

Unlike the usual white ceramic layer, such a black ceramic layer contains a metal, e.g., titanium, and hence, it naturally lowers the insulating property. For this reason, where the black ceramic layer is utilized in a multi-place display device in which the degree of integration for interconnections is high and the interconnection interval is extremely narrow, a leakage current due to inferior insulation is generated, to cause an attenuation of the input signal, cross-talk phenonmenon and similar adverse effects.

In particular, in the display device having several places to ten and several or more places, the above problem cannot be neglected on account of a high degree of integration for interconnections and an extremely small interconnection interval.

Such degradation of the insulating property may be prevented by decreasing the quantity of $TiO_2$ to be mixed into the alumina paste. In that case, however, the decrease results in a decrease in blackness since the ionized $TiO_2$ is the factor of the black color. The original purpose of making the indication distinct cannot, therefore, be accomplished.

SUMMARY OF THE INVENTION

The present invention has been made in order to eliminate the problems as stated above.

An object of the present invention is to blacken selected parts of the background of display portions of a light-emitting display device, to thereby make the indication of the display portions distinct.

Another object is to prevent a lowering of the insulating property between interconnections in a light-emitting display device.

The fundamental construction of the present invention for achieving the above-mentioned objects consists in a light-emitting display device wherein metallic interconnection layers are formed on a ceramic substrate with ceramic layers used as insulating layers and wherein light-emitting elements and electrode terminals thereof are connected to parts of said metallic interconnection layers, characterized in that at least the main parts of said metallic interconnection layers are insulated by a white ceramic layer, and that a background portion of the light-emitting elements is formed of a black ceramic layer.

In accordance with this aspect of the invention, the main metallic interconnection layers having a high degree of integration and a narrow interconnection interval are insulated from each other by the usual white ceramic layer which has good insulating properties. On the other hand, at a surface part at which interconnections are of a small number and the interconnection interval is large, the insulation is less serious, the blackening can be made to some extent and the effect of a distinct indication is available.

Another construction of the present invention consists in the light-emitting display device having the foregoing fundamental construction, characterized in that the main metallic interconnection layers are formed with white ceramic layers used as insulating layers, and that only the uppermost metallic interconnection layer overlying the interconnection layers and connected with the light-emitting elements and the electrode terminals thereof is formed with a black ceramic layer used as an insulating layer.

Also, in this aspect of the invention, the main interconnection metal films at high degrees of integration are insulated by the usual white ceramic layers having good insulating properties. The interconnection metal film of the uppermost layer, consisting only of bonding portions of connector wires being the electrode terminals of the light-emitting elements and connection portions of the light-emitting elements, is insulated by the black ceramics. At this surface part, the interconnection interval is comparatively wide, and no obstruction occurs from the low insulating property of the black ceramics. The surface can, therefore, be made sufficiently black.

A further construction of the present invention consists in the aspect of having a fundamental construction, characterized in that multi-layer interconnections the uppermost layer of which is a metallic interconnection layer providing only bonding portions with the light-emitting elements and the electrode terminals of the elements connected thereto are formed with a white ceramic layer used as an insulating layer, and that a black ceramic layer is formed on the surface at a part other than said bonding portions.

In according with this aspect of the invention, all the metallic interconnection layers are insulated by the white ceramic layers having good insulating properties. On the other hand, the insulating properties of the surface part having no interconnection are not very critical to permit sufficiently blackened ceramics to be used.

A still further construction of the present invention is characterized in that the metallic interconnection layers and the insulating layers are formed on the ceramic substrate, that white ceramic layers are formed as insluating layers on said interconnection layer of the uppermost layer and at a part other than bonding portions with the light-emitting elements and their electrode terminals connected thereto, and that a black ceramic layer is formed on the white ceramic layers.

In this aspect of the invention, the metallic interconnection layers are surrounded by the white ceramic layers, while the black ceramic layer is formed on the white ceramic layers. Therefore, no substantial problem arises with respect to the insulating property between interconnections.

BRIEF DESCRIPTION OF THE DRAWINGS

All the drawings are sectional views each showing an embodiment of the present invention, in which.

PREFERRED EMBODIMENTS OF THE INVENTION

The present invention will be described in detail hereunder in connection with a few embodiments.

Figure 1:
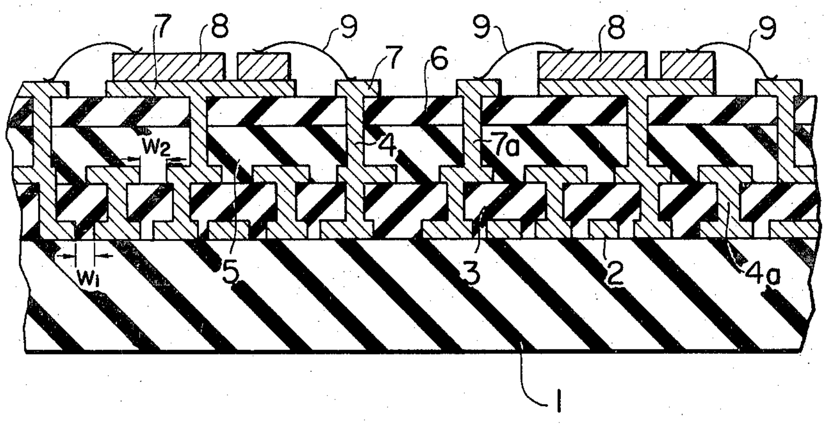
FIG. 1 illustrates a light-emitting display device having three layers of interconnections.

FIG. 1 is a sectional view showing a multi-position light-emitting display device of three layers.

Reference numeral 1 designates a ceramic substrate. Shown at 2 is a first metallic interconnection layer which is formed in contact with the substrate 1, and in which the degree of integration is extremely high and the interconnection interval is, accordingly, very narrow. A white ceramic layer 3 is formed on the first interconnection layer 2. A second metallic interconnection layer 4 is formed on the white ceramic layer 3. The first interconnection layer 2 and the second interconnection layer 4 are connected to each other through metal portions 4a of through-holes provided in the white ceramic layer 3. Numeral 5 indicates a second ceramic layer, while numeral 6 designates a black ceramic layer formed on the second ceramic layer 5. Numeral 7 represents the uppermost metallic interconnection layer. Gold plating is effecting on the uppermost interconnection layer 7 as bonding portions for connecting light-emitting elements 8 to be mounted thereon and connector wires 9 being electrode terminals of the elements. The uppermost metallic interconnection layer 7 is connected with the second metallic interconnection layer 4 through metal portions 7a. The interconnection interval of the uppermost interconnection layer 7 is wide compared with those of the underlying interconnection layers. Each light-emitting element 8 is a luminescent diode which makes use of the fact that light is emitted by applying a voltage to a P-N junction of a III—V family intermetallic compound semiconductor in the forward direction. In general, the luminescent diode luminesces with a red or green color. The connector wire 9 connects an electrode of the element and the interconnection bonding portion.

In order to produce the light-emitting display device, a paste containing a powder of a high-fusing metal such as tungsten, molybdenum and tantalum and a paste containing alumina and silica which constitute a ceramic material are alternately printed on a substrate 1 of ceramics which has not yet been sintered—termed a green sheet. After each printing operation, a drying treatment is carried out. Thus, the multi-layer structure of the metallic interconnection layers and the insulating layers is formed.

The ceramic insulating layers formed of the above ceramic material generally present a white color. The uppermost ceramic layer must be formed into the black ceramic layer. The material of the black ceramic layer includes alumina ($Al_2O_3$) of 91.3 percent by weight of a ceramic material as its principal ingredient, to which are added silica ($SiO_2$) of 2.9 percent by weight, magnesium oxide ($MgO$) of 1.9 percent by weight, and titanium dioxide ($TiO_2$) of 3.9 percent by weight as a blackening material. In the present invention, it is desirable that the included $TiO_2$ be of from 1 to 10 percent weight, especially 1 to 4 percent by weight. When the black ceramic layer material is printed and the printed material layer is sintered along with the layers of the other ceramic material in a reducing atmosphere, the color of the layer for the black ceramic layer changes to black. After the sintering operation, gold is plated on those parts of the surface metallic interconnection layer which become the bonding portions, in order to enhance adhesive properties and to prevent rust. Connections of the light-emitting elements and their electrodes are made on the plated areas. Thus, the device is completed.

Since, with such a light-emitting display device, only the portions of the light-emitting element 8 and the connector bonding wires 9 are formed on the black surface ceramic layer 6, an indication of high contrast with the background and extremely distinct during light emission is provided. On the other hand, regarding the insulating, the interconnection layers having a high degree of integration are insluated by the usual white ceramics having good insulating properties. Insulated by the black ceramics is the metallic interconnection portion which merely provides the bonding pad portions of the light-emitting elements and the connector wires. The interconnection interval of the metallic interconnection portion is extremely wide, and gives rise to no problem in respect of the insulation.

Figure 2:
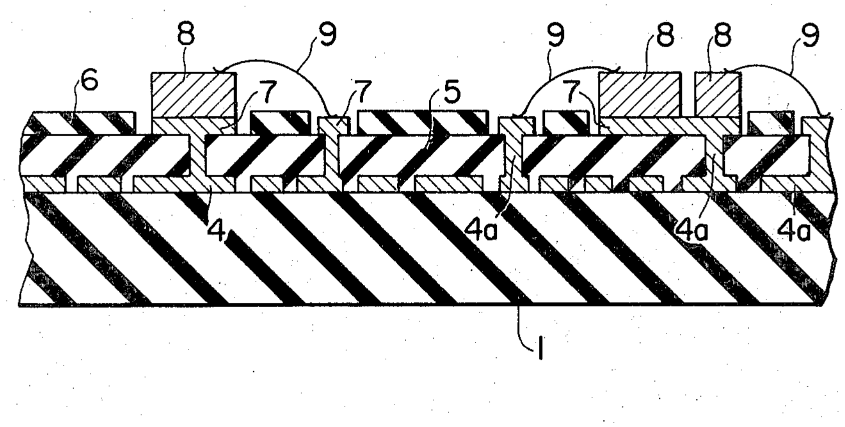
FIG. 2 illustrates a light-emitting display device having two layers of interconnections.

FIG. 2 is a sectional view which shows a multi-position light-emitting display device of two layers as another embodiment of the present invention.

In the device, interconnections at the surface consist only of connection portions of the light-emitting elements 8 and the connector wires 9, and are insulated by the usual ceramic layer. Except for the connection portions, the black ceramic layer 6 is formed over the interconnection layer 4 through the white ceramic layer.

Accordingly, as is apparent from the figure, the black ceramic layer 6 is not in direct contact with the interconnection portion. Therefore, the problem of the insulating property does not arise.

Figure 3:
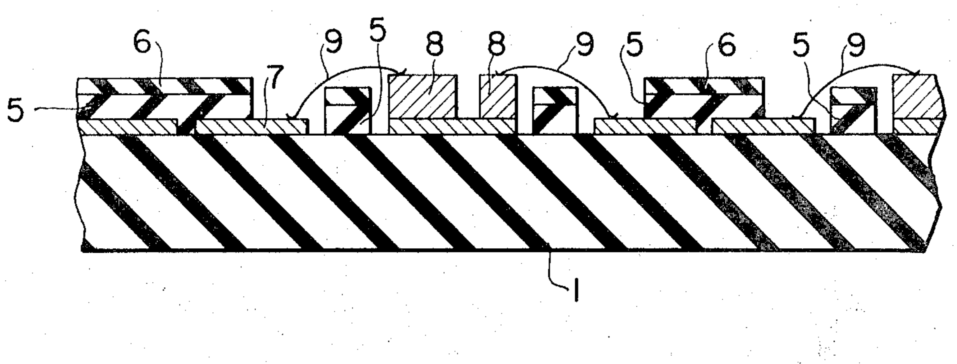
FIG. 3 illustrates a light-emitting display device having a single layer of interconnections.

FIG. 3 also shows still another embodiment of a light-emitting emitting display device of the invention. According to the device, interconnections are made on the surface of the substrate, the white ceramic layer 5 is formed on the interconnections to protect them, and the black ceramic layer 6 is formed on the white ceramic layer 5. The construction is suitable for a display device having a single layer of interconnections and having a relatively high degree of integration of the interconnections, but it is also applicable to multi-layer interconnections. In the device, the black ceramic layer is not in direct contact with the interconnection layer either and, accordingly, no problem arises with respect to insulating properties.

We claim:

1. A light-emitting display device wherein metallic interconnection layers are formed on a ceramic substrate with ceramic insulating layers and wherein light-emitting elements and electrode terminals thereof are connected to parts of said metallic interconnection layers, characterized in that at least main parts of said metallic interconnection layers are insulated by a white ceramic layer, and that a background portion of said light-emitting elements is formed of a black ceramic layer.

2. The light-emitting display device as defined in claim 1, characterized in that said main parts of said metallic interconnection layers are formed with white ceramic insulating layers, and that only an uppermost metallic interconnection layer to which the light-emitting elements and their electrode terminals are connected is formed with a black ceramic layer as an insulating layer.

3. The light-emitting display device as defined in claim 1, characterized in that uppermost layers of multi-layer interconnections, to which the light-emitting elements and their electrode terminals are connected, are formed on a white ceramic insulating layer, and that a black ceramic layer is formed on parts of said last-mentioned white ceramic insulating layer on which said uppermost layers of the multi-layer interconnections are not formed.

4. The light-emitting display device as defined in claim 1, characterized in that the metallic interconnection layers are formed on the ceramic substrate, that white ceramic insulating layers are formed on that part of an uppermost metallic interconnection layer which is other than bonding portions of said uppermost interconnection layer connected to the light-emitting elements and their electrode terminals, and that a black ceramic layer is formed on said white ceramic layers.

5. A light-emitting display device comprising:
- a ceramic substrate;
- a plurality of metallic interconnection layers separated from each other and disposed on a principal surface of said substrate;
- light-emitting diode elements disposed on selected ones of said metallic interconnection layers;
- white ceramic insulator layer portions disposed on said substrate between individual ones of said metallic interconnection layers;
- conductor wires respectively connected between said light-emitting diode elements and prescribed ones of said interconnection layers other than said selected ones, and
- black ceramic layer portions disposed on those white ceramic insulator layer portions which are at least adjacent said light-emitting diode elements.

6. A light-emitting device according to claim 5, wherein said conductor wires extend over black ceramic layer portions disposed between those metallic interconnection layers on which said diode elements are disposed and those interconnection layers to which said wires are connected.

7. A light-emitting device according to claim 5, wherein said white ceramic insluator layer portions comprise a stack of successively arranged white ceramic insulator layers disposed on the surface of said substrate, said black ceramic layer portions are disposed on the surface of the uppermost white ceramic insulating layer, and said interconnection layers, on which said diode elements are disposed and to which said wires are connected, extend from said principal surface of said substrate to the upper surface of said black ceramic layer portions through said white ceramic insulator layers.

8. A light-emitting device according to claim 5, wherein said white ceramic insulator layer portions comprise a layer of a white ceramic insulator material disposed on said substrate, said interconnection layers to which said diode elements and said conductor wires are contacted, extend from the principal surface of said substrate to the upper surface of said layer of white ceramic insulator material through the last-mentioned layer, and said black ceramic layer portions are disposed on those upper surface portions of said white ceramic insulator layer other than the portions on which interconnection layers are disposed.

9. A light-emitting device according to claim 5, wherein said white ceramic layer portions are disposed on said substrate between each of said interconnection layer portions and each of said white ceramic layer portions has its upper surface covered by a layer of black ceramic material.

10. A light-emitting device according to claim 5, wherein each interconnection layer to which a conductor wire is connected and on which a diode element is disposed is spaced from a black ceramic layer portion disposed therebetween.

11. A light-emitting device according to claim 5, wherein said black ceramic layer contains prescribed amounts of $Al_2O_3$, $SiO_2$, MgO and $TiO_2$.

12. A light-emitting device according to claim 11, wherein the amount of $TiO_2$ in said black ceramic layer is from 1 to 10 percent by weight.

13. A light-emitting device according to claim 12, wherein the amount of $TiO_2$ in said black ceramic layer is from 1 to 4 percent by weight.

* * * * *